(12) United States Patent
Seo et al.

(10) Patent No.: US 9,601,556 B2
(45) Date of Patent: Mar. 21, 2017

(54) ORGANIC LIGHT EMITTING DISPLAY DEVICE AND METHOD OF MANUFACTURING THE SAME

(71) Applicant: LG DISPLAY CO., LTD., Seoul (KR)

(72) Inventors: Hyun Sik Seo, Goyang-si (KR); Jong Sik Shim, Goyang-si (KR); Kyung Han Seo, Paju-si (KR); Yong Ho Choi, Seoul (KR); Hyo Jin Park, Yeosu-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/057,976

(22) Filed: Mar. 1, 2016

(65) Prior Publication Data

US 2016/0181344 A1    Jun. 23, 2016

Related U.S. Application Data

(62) Division of application No. 14/533,516, filed on Nov. 5, 2014, now Pat. No. 9,299,761.

(30) Foreign Application Priority Data

Dec. 31, 2013 (KR) .......................... 10-2013-0169457

(51) Int. Cl.
*H01L 27/32* (2006.01)
*H01L 29/786* (2006.01)

(52) U.S. Cl.
CPC ...... *H01L 27/3272* (2013.01); *H01L 27/3262* (2013.01); *H01L 27/3276* (2013.01); *H01L 29/78633* (2013.01); *H01L 29/78648* (2013.01); *H01L 29/7869* (2013.01)

(58) Field of Classification Search
CPC ................................................. H01L 29/78633
See application file for complete search history.

(56) References Cited

U.S. PATENT DOCUMENTS

2012/0320004 A1    12/2012    Kitakado
2013/0026475 A1    1/2013    Choi

*Primary Examiner* — Seahvosh Nikmanesh
(74) *Attorney, Agent, or Firm* — Dentons US LLP

(57) ABSTRACT

An organic light emitting display device includes a driving thin film transistor (TFT), the driving thin film TFT includes a lower gate, a source, and a drain on a substrate and on the same layer; a first gate insulating layer covering the lower gate, the source, and the drain; an active layer on the first gate insulating layer; a conductive line contacting the source and the drain; a second gate insulating layer on the active layer; and an upper gate on the second gate insulating layer, wherein the lower gate of the driving TFT is a light shield that blocks light from being irradiated onto the active layer, and the lower gate and the source include the same metal.

4 Claims, 9 Drawing Sheets

< Drain-LS contact >

FIG. 13B

< Double gate >

ORGANIC LIGHT EMITTING DISPLAY DEVICE AND METHOD OF MANUFACTURING THE SAME

CROSS-REFERENCE TO RELATED APPLICATIONS

This application is a divisional of U.S. application Ser. No. 14/533,516 filed Nov. 5, 2014, and claims the benefit of the Korean Patent Application No. 10-2013-0169457 filed on Dec. 31, 2013, which are incorporated by reference for all purposes as if fully set forth herein.

BACKGROUND

Field of the Disclosure

The present invention relates to an organic light emitting display device. More particularly, the present invention relates to an organic light emitting display device that blocks light from being irradiated onto an oxide thin film transistor (TFT) by using a light shield formed of a source/drain metal, and a method of manufacturing the same which can reduce the number of masks to increase manufacturing efficiency.

Discussion of the Related Art

Liquid crystal display (LCD) devices, which are widely used, need a backlight as a light source, and have technical limitations in brightness, contrast, and a viewing angle. Organic light emitting devices, on the other hand, self-emit light. The organic light emitting devices do not need a separate light source and have relatively better brightness, contrast, and viewing angle. Thus, interest in the organic light emitting devices is increasing.

Organic light emitting display devices emit light from an organic light emitting diode (OLED) formed in each of a plurality of pixels, thereby displaying an image. The OLED has a structure in which an emission layer is formed between a cathode for injecting an electron and an anode for injecting a positive hole. When an electron generated from the cathode and a positive hole generated from the anode are injected into the emission layer, the electron and the positive hole are combined to generate an exciton, and the generated exciton is shifted from an excited state to a ground state to emit light, thereby displaying an image.

The organic light emitting display devices are categorized into passive matrix organic light emitting display devices and active matrix organic light emitting display devices depending on a driving mode.

The passive matrix organic light emitting display devices have a structure in which a plurality of pixels are arranged in a matrix type without including a thin film transistor (TFT). For this reason, the passive matrix organic light emitting display devices have high power consumption, and are limited in resolution.

On the other hand, active matrix organic light emitting display devices have a structure in which a plurality of pixels each include a TFT and are arranged in a matrix type. Each of the plurality of pixels is driven according to the turn-on of the TFT and a voltage charged into a storage capacitor.

Therefore, the active matrix organic light emitting display devices have lower power consumption and a higher resolution than the passive matrix organic light emitting display devices. An active matrix OLED is suitable for display devices that require a high resolution and a large area. For reference, in the present specification, an active matrix organic light emitting device is briefly referred to as an organic light emitting device.

Figure 1:
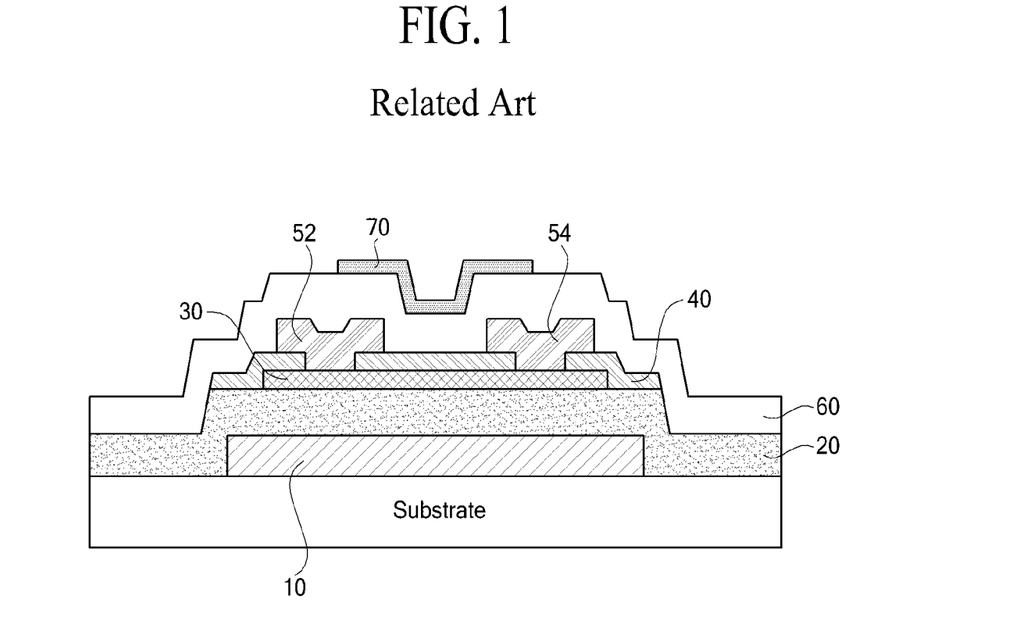
FIG. 1 is a cross-sectional view illustrating a structure of a TFT formed in a pixel of a related art organic light emitting display device.

FIG. 1 is a cross-sectional view illustrating a structure of a TFT formed in a pixel of a related art organic light emitting display device.

Referring to FIG. 1, a lower gate 10 is formed on a substrate, and a gate insulating layer 20 is formed to cover the lower gate 10.

An active layer 30 is formed at a portion of a top of the gate insulating layer 20 which overlaps the lower gate 10, and an etch stop layer 40 is formed at the active layer 30.

A portion of the etch stop layer 40 is etched to expose the active layer 30, and a source 52 and a drain 54 are formed to contact the exposed active layer 30.

A protective layer 60 is formed to cover the gate insulating layer 20, the etch stop layer 40, the source 52, and the drain 54. An upper gate 70 is formed at a portion of a top of the protective layer 60 which overlaps the active layer 30.

A TFT is formed in an etch stop (ES)-double gate (DG) structure which includes the lower gate 10, the gate insulating layer 20, the active layer 30, the source 52, the drain 54, the protective layer 60, and the upper gate 70.

In the TFT of the related art, a turn-on/off capacitance is large, and short circuit occurs between a source/drain metal and a metal of an upper gate. For this reason, there is a high possibility that a hot spot and a dark spot occur.

Moreover, a kickback increases, and the boosting efficiency is reduced, causing a problem of an image quality of an OLED panel. The TFT and a storage capacitor are separately formed, and an area occupied by the TFT and storage capacitor increases, causing a reduction in an opening of a pixel. For this reason, it is difficult to apply a high-resolution OLED panel.

To overcome such limitations, the TFT should be formed in a coplanar structure. However, since an oxide TFT has vulnerable characteristic in which a characteristic of a device is changed by light, a light shield should be separately formed under the active layer 30.

Moreover, a total of eight masks are used in a process of manufacturing a TFT. As such, the process time and cost increase.

SUMMARY OF THE INVENTION

Accordingly, the present invention is directed to an organic light emitting display device and a method of manufacturing the same that substantially obviate one or more problems due to limitations and disadvantages of the related art.

An aspect of the present invention provides an organic light emitting display device for blocking light from being irradiated onto an oxide TFT and a method of manufacturing the same.

Another aspect of the present invention provides a method of manufacturing an organic light emitting display device, which decreases the number of masks used in a process of manufacturing a TFT, thereby increasing the manufacturing efficiency.

Another aspect of the present invention provides an organic light emitting display device and a method of manufacturing the same, which can increase a capacitance of a storage capacitor.

In addition to the aforesaid aspects of the present invention, other features and advantages of the present invention will be described below, but will be clearly understood by those skilled in the art from descriptions below.

Additional advantages and features of the invention will be set forth in part in the description which follows and in part will become apparent to those having ordinary skill in the art upon examination of the following or may be learned from practice of the invention. These and other advantages of the invention may be realized and attained by the structure particularly pointed out in the written description and claims hereof as well as the appended drawings.

To achieve these and other advantages and in accordance with the purpose of the invention, as embodied and broadly described herein, there is provided an organic light emitting display device including a switching thin film transistor (TFT) that includes: a lower gate, a source, and a drain formed on a substrate and on the same layer; a first gate insulating layer formed to cover the lower gate, the source, and the drain; an active layer formed on the first gate insulating layer; a conductive line formed to contact the source and the drain; a second gate insulating layer formed on the active layer; and an upper gate formed on the second gate insulating layer, wherein the lower gate of the switching TFT is a light shield that blocks light from being irradiated onto the active layer.

In another aspect of the present invention, there is provided an organic light emitting display device including a driving thin film transistor (TFT) that includes: a lower gate, a source, and a drain formed on a substrate and on the same layer; a first gate insulating layer formed to cover the lower gate, the source, and the drain; an active layer formed on the first gate insulating layer; a conductive line formed to contact the source and the drain; a second gate insulating layer formed on the active layer; and an upper gate formed on the second gate insulating layer, wherein the lower gate of the driving TFT is a light shield that blocks light from being irradiated onto the active layer, and the lower gate and the source are formed of the same metal in common.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

In the specification, in adding reference numerals for elements in each drawing, it should be noted that like reference numerals already used to denote like elements in other drawings are used for elements wherever possible.

The terms described in the specification should be understood as follows.

As used herein, the singular forms "a", "an" and "the" are intended to include the plural forms as well, unless the context clearly indicates otherwise. The terms "first" and "second" are for differentiating one element from the other element, and these elements should not be limited by these terms.

It should be further understood that the terms "comprises", "comprising,", "has", "having", "includes" and/or "including", when used herein, specify the presence of stated features, integers, steps, operations, elements, and/or components, but do not preclude the presence or addition of one or more other features, integers, steps, operations, elements, components, and/or groups thereof.

In description of embodiments of the present invention, when a structure is described as being formed at an upper portion/lower portion of another structure or on/under the other structure, this description should be construed as including a case where the structures contact each other and moreover a case where a third structure is disposed therebetween.

Before providing a description with reference to the drawings, an organic light emitting display device according to an embodiment of the present invention includes an OLED panel and a driving circuit unit that drives the OLED panel.

A plurality of pixels are arranged in a matrix type in the OLED panel, and a plurality of lines, which supply power and a signal to an OLED and a pixel circuit which are included in each of the plurality of pixels, are formed in the OLED panel.

The plurality of lines include a data line, a scan line, a sensing signal line, a VDD line, and a reference voltage line. Although not shown, the plurality of lines may further include an emission signal line.

The data line and the reference voltage line are formed to cross a corresponding pixel in a height direction. The scan line and the sensing signal line are formed to cross the corresponding pixel in a width direction. Here, the VDD line may be formed in a width direction or a height direction in the corresponding pixel.

Each of the plurality of pixels includes an opening, in which an OLED is formed to emit light, and a pixel circuit unit which includes a driving circuit for driving the OLED.

The pixel circuit unit includes a plurality of TFTs and a storage capacitor. Each of the plurality of TFTs includes a driving TFT, a scan TFT, and a sensing TFT.

The storage capacitor charges with a threshold voltage "Vth" of the driving TFT, and allows a driving current based on a data voltage to flow in the OLED.

The scan TFT is turned on by a scan signal applied to the scan line, and supplies the data voltage, applied to the date line, to the driving TFT.

The sensing TFT is turned on by a sensing signal applied to the sensing signal line, and supplies a display reference voltage "Vref" or a sensing precharging voltage "Vpre", supplied to the reference voltage line, to a node which is connected to the driving TFT (DT) and the OLED. In each pixel, the sensing TFT is disposed under the storage capacitor and the driving TFT.

The driving TFT is turned on with the data voltage, and adjusts an amount of data current "Ioled" which flows from a first driving voltage VDD terminal to a second driving voltage VSS terminal. Emission of light from the OLED is adjusted by adjusting the amount of the data current.

The driving TFT, the scan TFT, and the sensing TFT may be formed in an N type or a P type by using oxide as an active material.

Hereinafter, an organic light emitting display device and a method of manufacturing the same according to an embodiment of the present invention will be described in detail with reference to the accompanying drawings.

Figure 2:
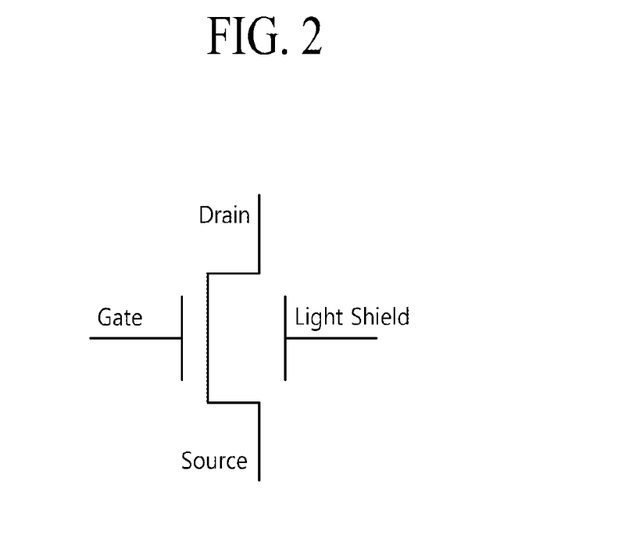
FIG. 2 is an equivalent circuit of a switching TFT formed in a pixel of an organic light emitting display device according to an embodiment of the present invention.

FIG. 2 is an equivalent circuit of a switching TFT formed in a pixel of an organic light emitting display device according to an embodiment of the present invention.

Referring to FIG. 2, a switching TFT of the organic light emitting display device according to an embodiment of the present invention configures a light shield along with a source and a drain, and has a structure in which the light shield is floated.

Figure 3:
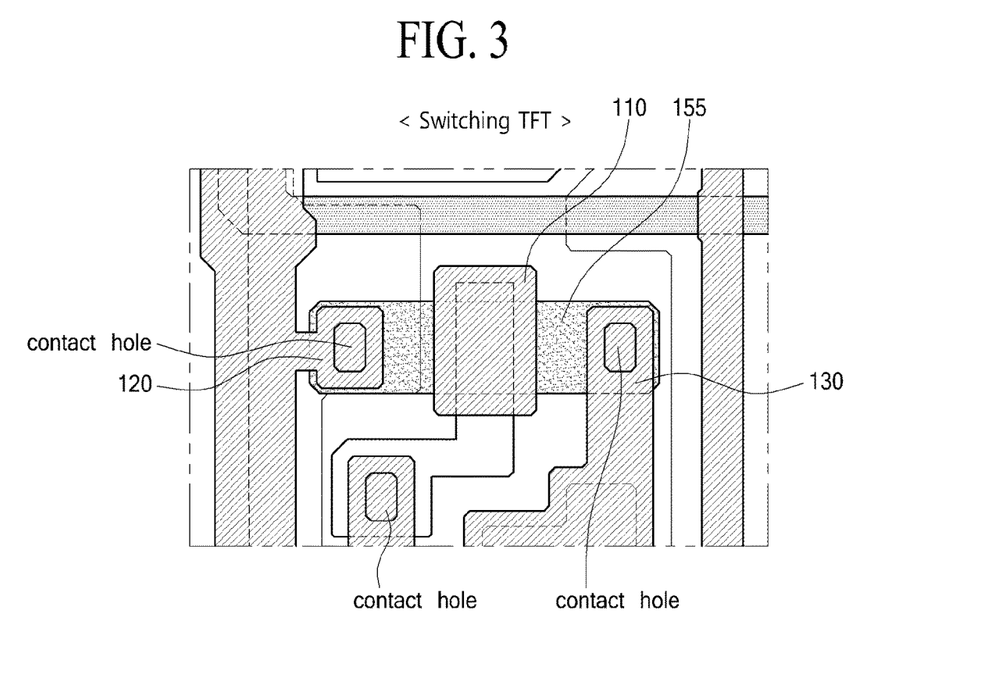
FIG. 3 is a plan view of a switching TFT formed in a pixel of an organic light emitting display device according to an embodiment of the present invention.
Figure 4:
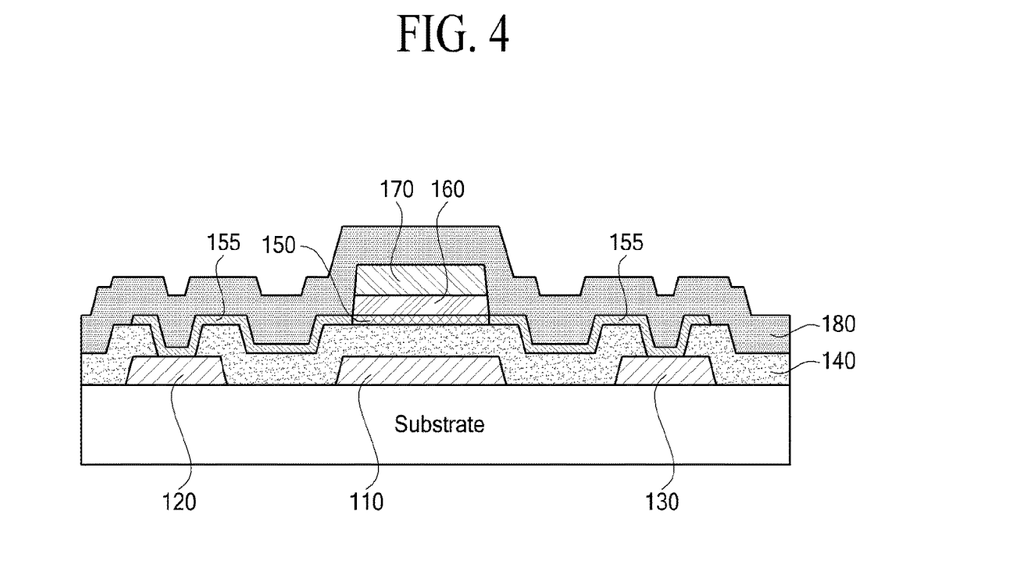
FIG. 4 is a cross-sectional view illustrating a structure of the switching TFT of FIG. 3.

FIG. 3 is a plan view of a switching TFT formed in a pixel of an organic light emitting display device according to an embodiment of the present invention, and FIG. 4 is a cross-sectional view illustrating a structure of the switching TFT of FIG. 3. FIGS. 3 and 4 illustrate one of a plurality of switching TFTs, and illustrates a switching TFT having an etch stop layer (ESL) type.

Referring to FIGS. 3 and 4, a lower gate 110, a source 120, and a drain 130 are formed in a switching TFT area on a substrate. The lower gate 110, the source 120, and the drain 130 are formed of the same metal on the same layer. Here, the lower gate 110 may perform a function of a light shield, in addition to a function of a gate of a TFT.

The lower gate 110, the source 120, and the drain 130 may be formed of molybdenum (Mo), titanium (Ti), or copper (Cu) in a single layer structure. As another example, the lower gate 110, the source 120, and the drain 130 may be formed in a multi-layer structure. A first layer may be formed of an alloy of molybdenum-titanium (MoTi) to have a thickness of 500 nm, and a second layer may be formed of copper (Cu) to have a thickness of 30 nm.

A first gate insulating layer 140 (GI 1) is formed to cover the lower gate 110, the source 120, and the drain 130.

The first gate insulating layer 140 includes a first layer formed of $SiO_2$ and a second layer formed of SiNx. A $SiO_2$ layer is formed to a thickness of 400 nm, and a SiNx layer is formed to a thickness of 30 nm.

An active layer 150 is formed in a switching TFT (SW-TFT) area on the first gate insulating layer 140. The active layer 150 is formed of oxide, such as indium-gallium oxide (IGO), indium-zinc oxide (IZO), or amorphous indium-gallium zinc oxide (IGZO), to a thickness of 65 nm.

A conductive line 155, which contacts the source 120 and the drain 130, is formed on the first gate insulating layer 140.

Here, a semiconductor material for forming the active layer 150 is metallized to become the conductive line 155 in a manufacturing process. The active layer 150 and conductive line 155 of the TFT are substantially formed of the same material and as one layer.

A second gate insulating layer 160 (GI 2) is formed to cover the active layer 150, and an upper gate 170 is formed on the second gate insulating layer 160 (GI 2).

The second gate insulating layer 160 is formed of $SiO_2$ to have a thickness of 150 nm.

The upper gate 170 may be formed in a multi-layer structure. A first layer may be formed of an alloy of copper-molybdenum-titanium (Cu—Mo—Ti) to have a thickness of 340 nm, and a second layer may be formed of Ti to have a thickness of 30 nm.

A protective layer 180 is formed to cover a switching TFT and the conductive line 155. The protective layer 180 is formed of $SiO_2$ to have a thickness of 450 nm.

The switching TFT is configured with the lower gate 110, the source 120, the drain 130, the first gate insulating layer 140, the active layer 150, the second gate insulating layer 160, and the upper gate 170.

The switching TFT of the organic light emitting display device according to an embodiment of the present invention including the above-described elements configures the lower gate 110 along with the source 120 and the drain 130. The lower gate 110 may be formed of a light shield, and blocks light from being irradiated onto the switching TFT.

Figure 5:
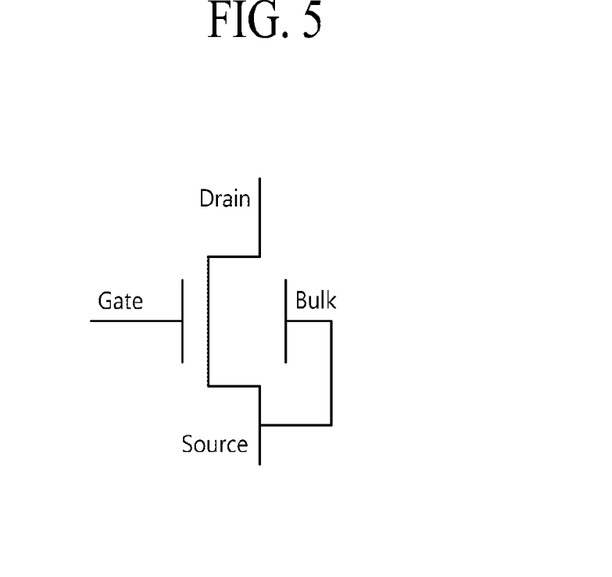
FIG. 5 is an equivalent circuit of a driving TFT formed in a pixel of an organic light emitting display device according to an embodiment of the present invention.

FIG. 5 is an equivalent circuit of a driving TFT formed in a pixel of an organic light emitting display device according to an embodiment of the present invention.

Referring to FIG. 5, a driving TFT of the organic light emitting display device according to an embodiment of the present invention configures a light shield along with a source and a drain, and has a structure in which the light shield contacts the source.

Figure 6:
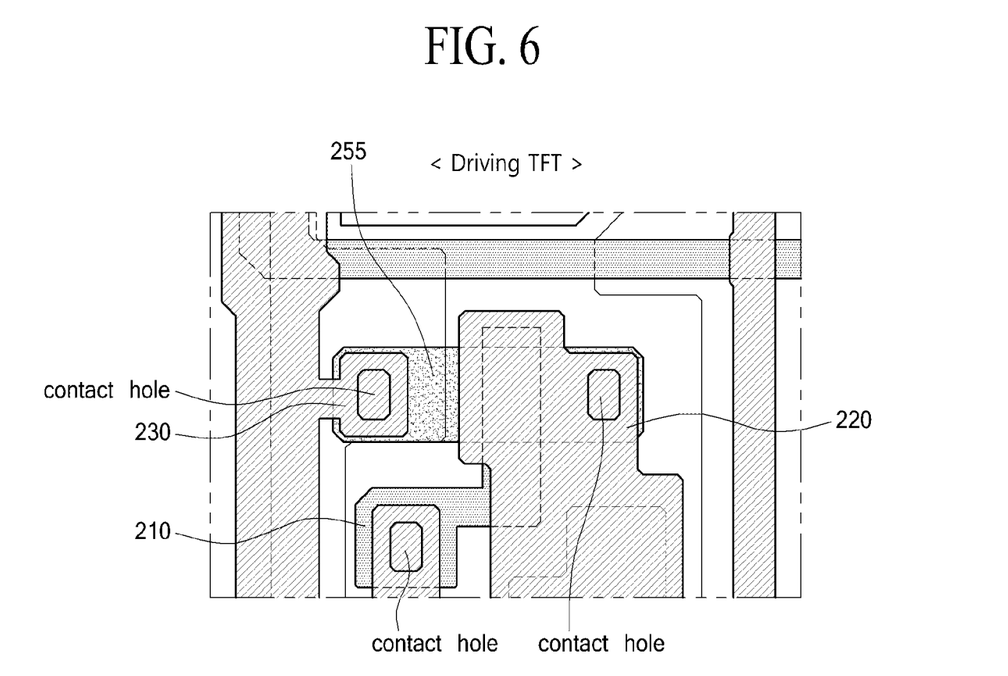
FIG. 6 is a plan view of a driving TFT formed in a pixel of an organic light emitting display device according to an embodiment of the present invention.
Figure 7:
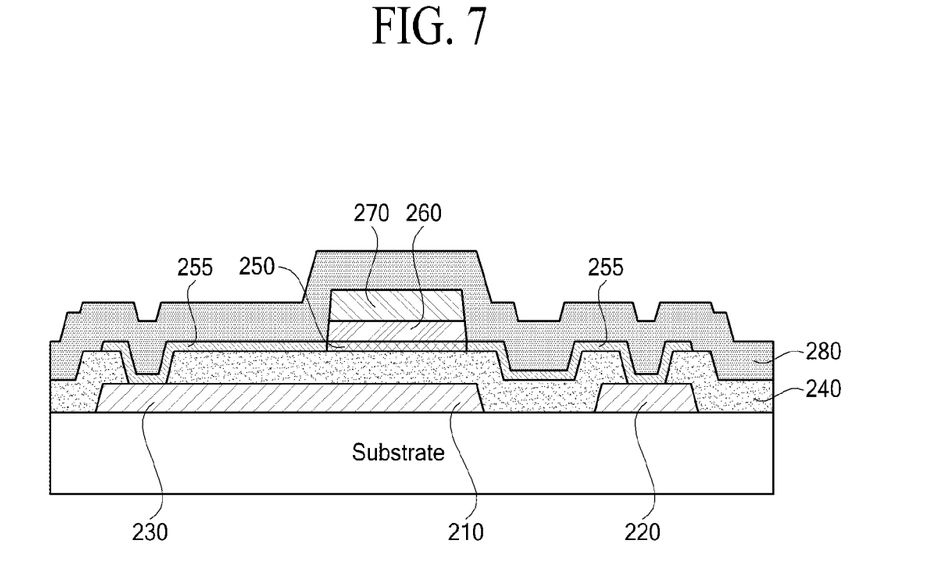
FIG. 7 is a cross-sectional view illustrating a structure of the driving TFT of FIG. 6.

FIG. 6 is a plan view of a driving TFT formed in a pixel of an organic light emitting display device according to an embodiment of the present invention, and FIG. 7 is a cross-sectional view illustrating a structure of the driving TFT of FIG. 6.

FIGS. 6 and 7 illustrate one of a plurality of driving TFTs, and illustrates a driving TFT having an ESL type.

Referring to FIGS. 6 and 7, a lower gate 210, a source 230, and a drain 220 are formed in a driving TFT area on a substrate. The lower gate 210, the source 230, and the drain 220 are formed of the same metal on the same layer. Here, the lower gate 210 may perform a function of a light shield, in addition to a function of a gate of a TFT.

The lower gate 210, the source 230, and the drain 220 may be formed of molybdenum (Mo), titanium (Ti), or copper (Cu) in a single layer structure. As another example, the lower gate 210, the source 230, and the drain 220 may be formed in a multi-layer structure. A first layer may be formed of an alloy of molybdenum-titanium (MoTi) to have a thickness of 500 nm, and a second layer may be formed of copper (Cu) to have a thickness of 30 nm.

A first gate insulating layer 240 (GI 1) is formed to cover the lower gate 210, the source 230, and the drain 220.

The first gate insulating layer 240 includes a first layer formed of $SiO_2$ and a second layer formed of SiNx. A $SiO_2$ layer is formed to a thickness of 400 nm, and a SiNx layer is formed to a thickness of 30 nm.

An active layer 250 is formed in a switching TFT (SW-TFT) area on the first gate insulating layer 240. The active layer 250 is formed of oxide, such as indium-gallium oxide (IGO), indium-zinc oxide (IZO), or amorphous indium-gallium zinc oxide (IGZO), to a thickness of 65 nm.

A conductive line 255, which contacts the source 230 and the drain 220, is formed on the first gate insulating layer 240.

Here, a semiconductor material for forming the active layer 250 is metallized to become the conductive line 255 in a manufacturing process. The active layer 250 and conductive line 255 of the TFT are substantially formed of the same material and as one layer.

A second gate insulating layer 260 (GI 2) is formed to cover the active layer 250, and an upper gate 270 is formed on the second gate insulating layer 260 (GI 2).

The second gate insulating layer 260 is formed of $SiO_2$ to have a thickness of 150 nm.

The upper gate 270 may be formed in a multi-layer structure. A first layer may be formed of an alloy of copper-molybdenum-titanium (Cu—Mo—Ti) to have a thickness of 340 nm, and a second layer may be formed of Ti to have a thickness of 30 nm.

A protective layer 280 is formed to cover a driving TFT and the conductive line 255. The protective layer 280 is formed of $SiO_2$ to have a thickness of 450 nm.

The driving TFT is configured with the lower gate 210, the source 230, the drain 220, the first gate insulating layer 240, the active layer 250, the second gate insulating layer 260, and the upper gate 270.

In the driving TFT of the organic light emitting display device according to an embodiment of the present invention including the above-described elements, the lower gate 210 formed as a light shield extends, and is formed in common with the source 230. That is, the lower gate 210 and the source 230 are formed in a structure where the lower gate 210 and the source 230 contact each other as one metal layer.

The lower gate 210, the source 230, and the drain 220 are formed together. The lower gate 110 may be formed of a light shield, and blocks light from being irradiated onto the driving TFT.

Figure 8:
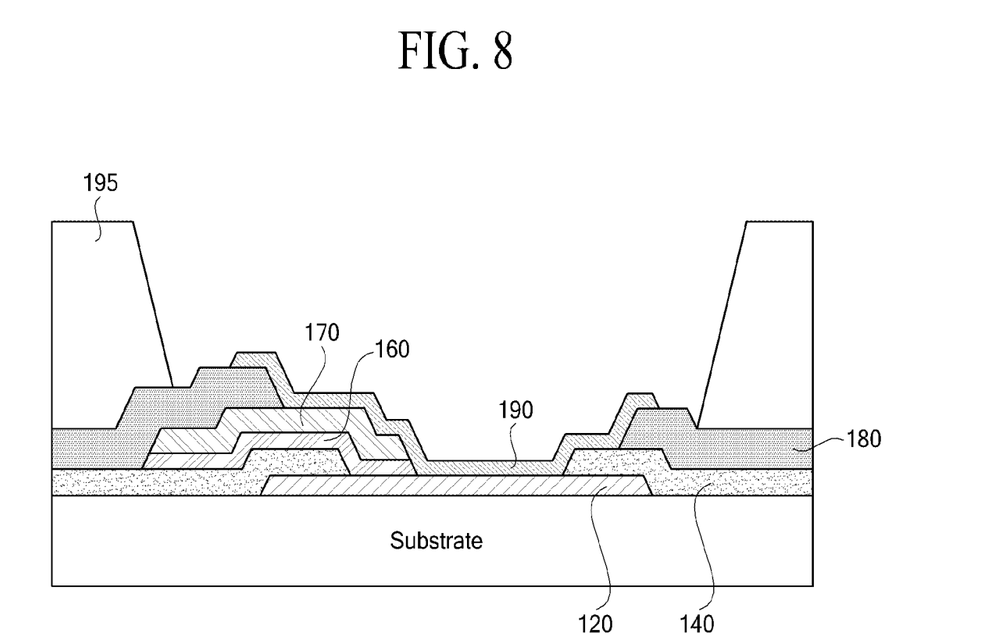
FIG. 8 is a view illustrating a contact structure in which a pixel electrode connects a source/drain metal to a gate metal.

FIG. 8 is a view illustrating a contact structure in which a pixel electrode connects a source/drain metal to a gate metal.

Referring to FIG. 8, a storage capacitor and a pad part may be simultaneously formed by using a manufacturing process of forming a switching TFT and a driving TFT.

The storage capacitor includes a first electrode which is formed on the same layer as that of a source and a drain, a second electrode which is formed on the same layer as that of an active layer, and a third electrode which is formed on the same layer as that of an upper gate.

Referring to FIG. 8, the first and third electrodes of the storage capacitor may be connected. In this case, the first and third electrodes of the storage capacitor may be connected by using a contact structure of FIG. 8.

A metal 120 of a source/drain layer may be connected to a metal 170 of an upper gate layer by using a pattern of a pixel electrode 190. In addition to the storage capacitor, even in a pad area, a metal of a lower layer may be connected to a metal of an upper layer by using the pattern of the pixel electrode 190.

Although not shown, in an organic light emitting display device according to an embodiment of the present invention, Cgs of a driving TFT of a pixel and one node of the storage capacitor may be merged and formed of the same metal. That is, a top gate of the driving TFT and an upper electrode of the storage capacitor may be merged and formed of the same metal, and thus, an area necessary for forming the driving TFT and the storage capacitor is reduced, and an aperture ratio of each pixel increases.

FIGS. 9A-9C and 10A-10B are views illustrating a method of manufacturing a switching TFT according to a first embodiment of the present invention. FIGS. 9A-9C and 10A-10B illustrate the method of manufacturing the switching TFT included in a pixel circuit unit. The switching TFT is formed in an ESL type.

The method of manufacturing an organic light emitting display device according to the first embodiment of the present invention forms the source, drain, and lower gate of the switching TFT on the same layer, and forms the lower gate as a light shield.

Figure 9A:
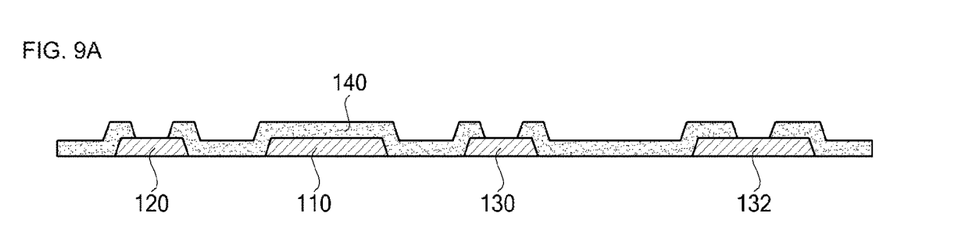
FIGS. 9A-9C and 10A-10B are views illustrating a method of manufacturing a switching TFT according to a first embodiment of the present invention.

Referring to FIG. 9A, a conductive metal material is coated on a substrate, and then, by performing a first mask process, the lower gate 110, the source 120, and the drain 130 are formed in the switching TFT (SW-TFT) area.

The lower gate 110, the source 120, and the drain 130 are formed of the same metal on the same layer. Here, the lower gate 110 may perform a function of a light shield, in addition to a function of a gate of a TFT.

The lower gate 110, the source 120, and the drain 130 may be formed of molybdenum (Mo), titanium (Ti), or copper (Cu) in a single layer structure. As another example, the lower gate 110, the source 120, and the drain 130 may be formed in a multi-layer structure. The first layer may be formed of an alloy of molybdenum-titanium (MoTi) to have a thickness of 500 nm, and the second layer may be formed of copper (Cu) to have a thickness of 30 nm.

Subsequently, the first gate insulating layer 140 (GI 1) is formed to cover the gate 110, the source 120, and the drain 130.

Subsequently, by using a second mask process, the first gate insulating layer 140 is etched by exposing a surface of each of the source 120, the drain 130, and a pad area 132.

Here, the first gate insulating layer 140 includes the first layer formed of $SiO_2$ and the second layer formed of SiNx. The $SiO_2$ layer is formed to a thickness of 400 nm, and the SiNx layer is formed to a thickness of 30 nm.

Figure 9B:
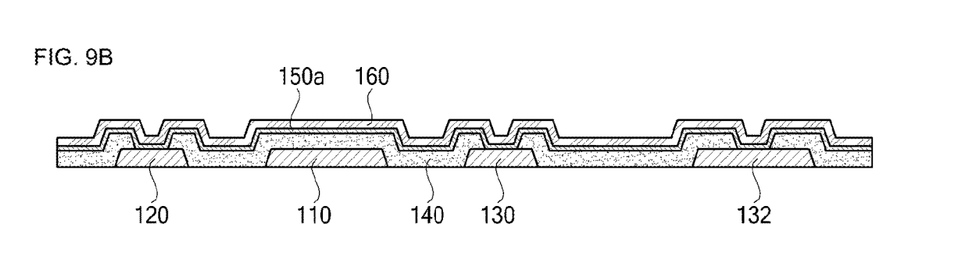

Subsequently, referring to FIG. 9B, by performing a third mask process, a semiconductor layer 150a is formed on the first gate insulating layer 140.

Subsequently, by performing a fourth mask process, the second gate insulating layer 160 is formed on the semiconductor layer 150a. The second gate insulating layer 160 is formed to cover the active layer 150. The second gate insulating layer 160 is formed of $SiO_2$ to have a thickness of 150 nm.

Figure 9C:
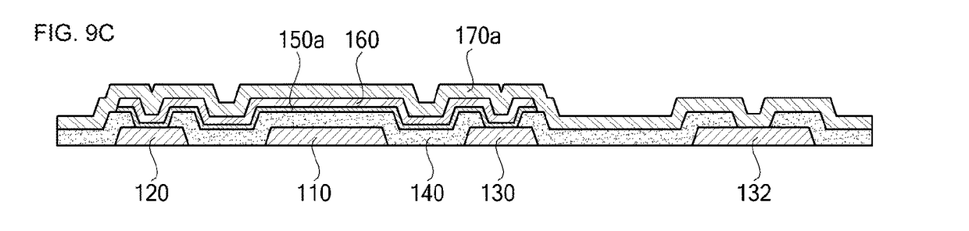

Subsequently, referring to FIG. 9C, a conductive metal material is deposited on the second gate insulating layer 160 to form an upper gate metal layer 170a.

Figure 10A:
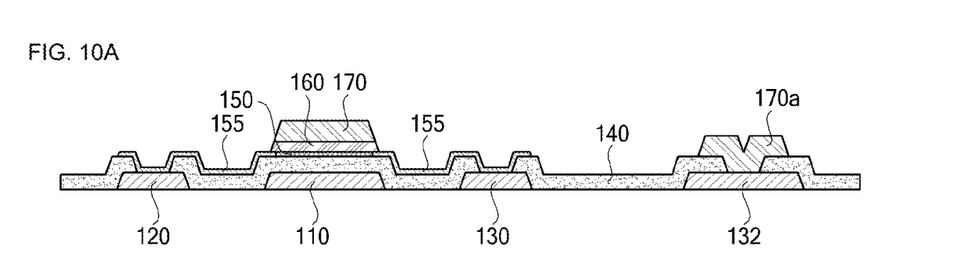

Subsequently, referring to FIG. 10A, by performing a fifth mask process, the second gate insulating layer 160 and the upper gate metal layer 170a are patterned. The upper gate 170 is formed on the second gate insulating layer 160.

The upper gate 170 may be formed in a multi-layer structure. The first layer may be formed of an alloy of copper-molybdenum-titanium (Cu—Mo—Ti) to have a thickness of 340 nm, and the second layer may be formed of Ti to have a thickness of 30 nm.

Subsequently, by using the upper gate 170 as a mask, the semiconductor layer 150a is metallized to form the conductive line 155 and the active layer 150.

The active layer 150 is formed of oxide, such as indium-gallium oxide (IGO), indium-zinc oxide (IZO), or amorphous indium-gallium zinc oxide (IGZO), to a thickness of 65 nm.

The conductive line 155, which contacts the source 120 and the drain 130, is formed on the first gate insulating layer 140.

Here, the semiconductor material for forming the active layer 150 is metallized to become the conductive line 155 in a manufacturing process. The semiconductor layer 150a blocked by the upper gate 170 becomes the active layer 150. The active layer 150 and conductive line 155 of the switching TFT are substantially formed of the same material and as one layer.

The switching TFT is configured with the lower gate 110, the source 120, the drain 130, the first gate insulating layer 140, the active layer 150, the second gate insulating layer 160, and the upper gate 170.

The protective layer 180 is formed to cover the switching TFT and the conductive line 155. The protective layer 180 is formed of $SiO_2$ to have a thickness of 450 nm.

Figure 10B:
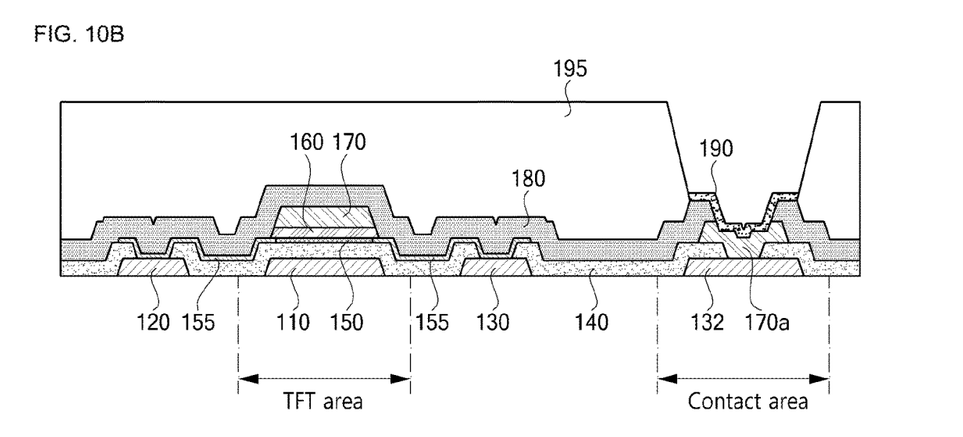

Subsequently, referring to FIG. 10B, an overcoat layer 195 is formed to cover the protective layer 180.

Subsequently, by performing a sixth mask process, a contact hole of a pad area 132 is formed by removing a portion of the overcoat layer 195 of the pad area 132. By using a pattern of the pixel electrode 190 in the contact hole, a metal layer of a source/drain layer is connected to a metal layer of an upper gate layer. The pattern of the pixel electrode 190 formed in the contact hole is formed in an island shape, and is formed for only contact without being connected to a pixel electrode formed in a pixel area.

In forming the switching TFT, the method of manufacturing the organic light emitting display device according to an embodiment of the present invention forms the lower gate 110 along with the source 120 and the drain 130, thereby simplifying a manufacturing process. Also, the lower gate 110 is formed as a light shield, and blocks light from being irradiated onto the switching TFT.

FIGS. 11A-11C and 12A-12B are views illustrating a method of manufacturing a switching TFT according to a second embodiment of the present invention. FIGS. 11A-11C and 12A-12B illustrate the method of manufacturing the switching TFT included in the pixel circuit unit. The switching TFT is formed in an ESL type.

According to the first embodiment described above with reference to FIGS. 9A-9C and 10A-10B, the switching TFT may be formed by performing the sixth mask process. According to the second embodiment to be described below with reference to FIGS. 11A-11C and 12A-12B, the switching TFT may be formed by performing the fifth mask process.

The method of manufacturing an organic light emitting display device according to the second embodiment of the present invention forms the source, drain, and lower gate of the switching TFT on the same layer, and forms the lower gate as a light shield.

Figure 11A:
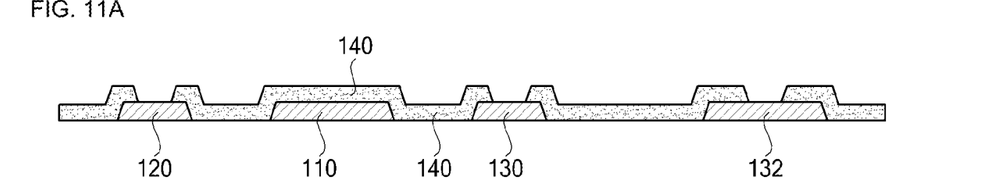
FIGS. 11A-11C and 12A-12B are views illustrating a method of manufacturing a switching TFT according to a second embodiment of the present invention.

Referring to FIG. 11A, a conductive metal material is coated on a substrate, and then, by performing a first mask process, the lower gate 110, the source 120, and the drain 130 are formed in the switching TFT (SW-TFT) area.

The lower gate 110, the source 120, and the drain 130 are formed of the same metal on the same layer. Here, the lower gate 110 may perform a function of a light shield, in addition to a function of a gate of a TFT.

The lower gate 110, the source 120, and the drain 130 may be formed of molybdenum (Mo), titanium (Ti), or copper (Cu) in a single layer structure. As another example, the lower gate 110, the source 120, and the drain 130 may be formed in a multi-layer structure. The first layer may be formed of an alloy of molybdenum-titanium (MoTi) to have a thickness of 500 nm, and the second layer may be formed of copper (Cu) to have a thickness of 30 nm.

Subsequently, the first gate insulating layer 140 (GI 1) is formed to cover the gate 110, the source 120, and the drain 130.

Subsequently, by using a second mask process, the first gate insulating layer 140 is etched by exposing a surface of each of the source 120, the drain 130, and a pad area 132.

Here, the first gate insulating layer 140 includes the first layer formed of $SiO_2$ and the second layer formed of SiNx. The $SiO_2$ layer is formed to a thickness of 400 nm, and the SiNx layer is formed to a thickness of 30 nm.

Figure 11B:
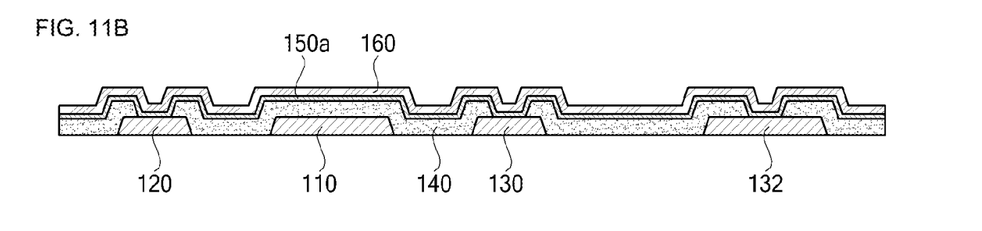

Subsequently, referring to FIG. 11B, a semiconductor layer 150a is formed on the first gate insulating layer 140.

Subsequently, the second gate insulating layer 160 is formed on the semiconductor layer 150a. The second gate insulating layer 160 is formed to cover the active layer 150. The second gate insulating layer 160 is formed of $SiO_2$ to have a thickness of 150 nm.

Figure 11C:
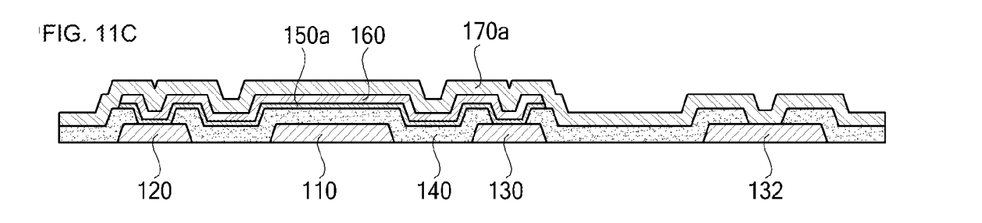

Subsequently, referring to FIG. 11C, by performing the third mask process, the second gate insulating layer 140 is patterned to expose a surface, formed in a source/drain layer, in a pad area 132.

Subsequently, a conductive metal material is deposited on the second gate insulating layer 160 to form an upper gate metal layer 170a.

Figure 12A:
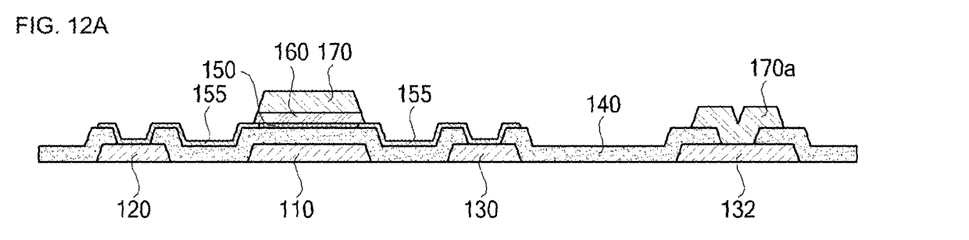

Subsequently, referring to FIG. 12A, by performing the fourth mask process, the second gate insulating layer 160 and the upper gate metal layer 170a are patterned. The upper gate 170 is formed on the second gate insulating layer 160.

The upper gate 170 may be formed in a multi-layer structure. The first layer may be formed of an alloy of copper-molybdenum-titanium (Cu—Mo—Ti) to have a thickness of 340 nm, and the second layer may be formed of Ti to have a thickness of 30 nm.

Subsequently, by using the upper gate 170 as a mask, the semiconductor layer 150a is metallized to form the conductive line 155 and the active layer 150.

The active layer 150 is formed of oxide, such as indium-gallium oxide (IGO), indium-zinc oxide (IZO), or amorphous indium-gallium zinc oxide (IGZO), to a thickness of 65 nm.

The conductive line 155, which contacts the source 120 and the drain 130, is formed on the first gate insulating layer 140.

Here, the semiconductor material for forming the active layer 150 is metallized to become the conductive line 155 in a manufacturing process. The semiconductor layer 150a blocked by the upper gate 170 becomes the active layer 150. The active layer 150 and conductive line 155 of the switching TFT are substantially formed of the same material and as one layer.

The switching TFT is configured with the lower gate 110, the source 120, the drain 130, the first gate insulating layer 140, the active layer 150, the second gate insulating layer 160, and the upper gate 170.

The protective layer 180 is formed to cover the switching TFT and the conductive line 155. The protective layer 180 is formed of $SiO_2$ to have a thickness of 450 nm.

Figure 12B:
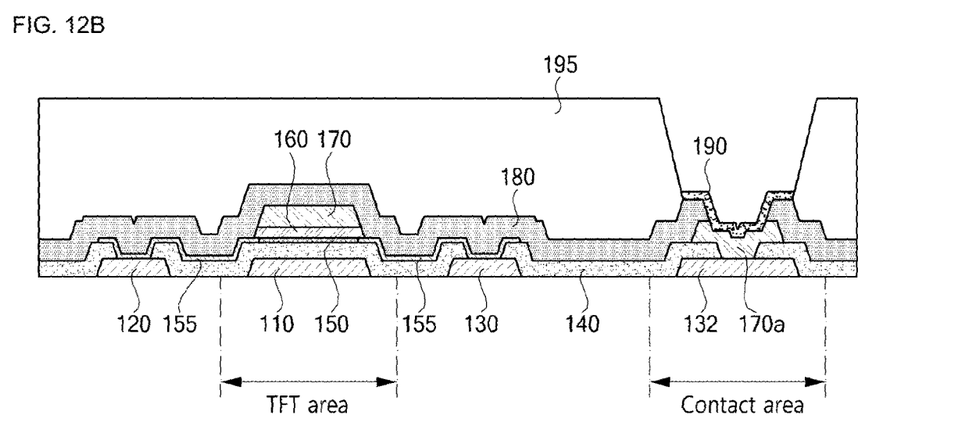

Subsequently, referring to FIG. 12B, an overcoat layer 195 is formed to cover the protective layer 180.

Subsequently, by performing a fifth mask process, a contact hole of a pad area is formed by removing a portion of the overcoat layer 195 of the pad area. By using a pattern of the pixel electrode 190 in the contact hole, a metal layer of a source/drain layer is connected to a metal layer of an upper gate layer. The pattern of the pixel electrode 190 formed in the contact hole is formed in an island shape, and is formed for only contact without being connected to a pixel electrode formed in a pixel area.

In forming the switching TFT, the method of manufacturing the organic light emitting display device according to an embodiment of the present invention forms the lower gate 110 along with the source 120 and the drain 130, thereby simplifying a manufacturing process. Also, the lower gate 110 is formed as a light shield, and blocks light from being irradiated onto the switching TFT.

Figure 13A:
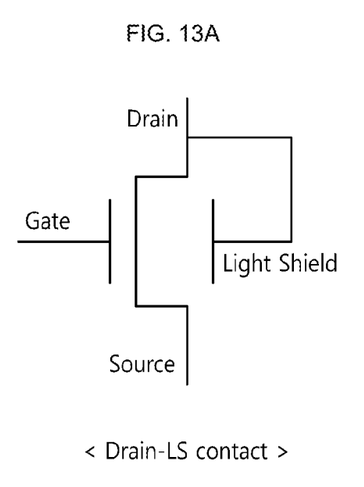
FIGS. 13A and 13B illustrate an equivalent circuit of a TFT structure according to another embodiment of the present invention, and illustrate a TFT, in which a drain contacts a light shield, and a TFT having a double gate.
Figure 13B:
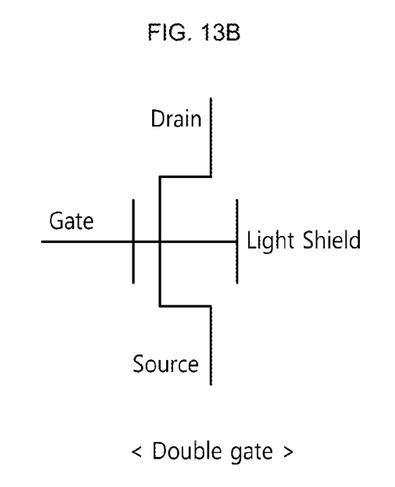

FIGS. 13A-13B illustrate an equivalent circuit of a TFT structure according to another embodiment of the present invention, and illustrate a TFT, in which a drain contacts a light shield, and a TFT having a double gate.

Referring to FIG. 13A, a switching TFT and a driving TFT may be formed in order for a light shield (a lower gate) to be connected to a drain.

Referring to FIG. 13B, the light shield is used as the lower gate, and the lower gate is connected to an upper gate, thereby forming the switching TFT and the driving TFT in a double gate structure.

In the organic light emitting display device and the method of manufacturing the same according to the embodiments of the present invention, light is blocked from being irradiated onto an oxide TFT, and the number of masks used in a process of forming a TFT is reduced, thereby increasing the manufacturing efficiency. Also, the storage capacitor is formed in a multi-layer structure, thereby increasing a capacitance of the storage capacitor.

The organic light emitting display device and the method of manufacturing the same according to the embodiments of the present invention can block light from being irradiated onto the oxide TFT.

The method of manufacturing an organic light emitting display device according to the embodiments of the present invention decreases the number of masks used in a process of manufacturing a TFT, thereby increasing the manufacturing efficiency.

The organic light emitting display device and the method of manufacturing the same according to the embodiments of the present invention can increase a capacitance of the storage capacitor.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display device comprising a driving thin film transistor (TFT), the driving thin film TFT comprising:
    a lower gate, a source, and a drain on a substrate and of the same layer;
    a first gate insulating layer covering the lower gate, the source, and the drain;
    an active layer on the first gate insulating layer;
    a conductive line contacting the source and the drain;
    a second gate insulating layer on the active layer; and
    an upper gate on the second gate insulating layer,
    wherein the lower gate of the driving thin film TFT blocks light from being irradiated onto the active layer, and the lower gate and the source include the same metal.

2. The organic light emitting display device of claim 1, wherein the conductive line is a semiconductor layer for forming the active layer, and the semiconductor layer is metallized.

3. The organic light emitting display device of claim 1, wherein the lower gate is connected to the drain.

4. The organic light emitting display device of claim 1, wherein the driving thin film TFT is a double gate structure with the lower gate connected to the upper gate.

* * * * *